(12) United States Patent
Tu et al.

(10) Patent No.: US 7,411,266 B2
(45) Date of Patent: Aug. 12, 2008

(54) SEMICONDUCTOR DEVICE HAVING TRENCH CHARGE COMPENSATION REGIONS AND METHOD

(75) Inventors: Shanghui Larry Tu, Phoenix, AZ (US); Gordon M. Grivna, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 182 days.

(21) Appl. No.: 11/442,733

(22) Filed: May 30, 2006

(65) Prior Publication Data

US 2007/0278592 A1    Dec. 6, 2007

(51) Int. Cl.
    *H01L 29/93*    (2006.01)
(52) U.S. Cl. .................. 257/492; 257/493; 438/268; 438/274
(58) Field of Classification Search .................. 257/492, 257/493; 438/268, 274
    See application file for complete search history.

(56) References Cited

U.S. PATENT DOCUMENTS

| | | | |
|---|---|---|---|
| 5,216,275 A | 6/1993 | Chen | |
| 5,438,215 A | 8/1995 | Tihanyi | |
| 5,872,421 A | 2/1999 | Potter | |
| 5,998,288 A | 12/1999 | Gardner et al. | |
| 6,184,555 B1 | 2/2001 | Tihanyi et al. | |
| 6,191,446 B1 | 2/2001 | Gardner et al. | |
| 6,210,999 B1 | 4/2001 | Gardner et al. | |
| 6,255,152 B1 | 7/2001 | Chen | |
| 6,274,904 B1 | 8/2001 | Tihanyi | |
| 6,278,165 B1 | 8/2001 | Oowaki et al. | |
| 6,355,955 B1 | 3/2002 | Gardner et al. | |
| 6,410,955 B1 | 6/2002 | Baker et al. | |
| 6,479,352 B2 | 11/2002 | Blanchard | |
| 6,509,240 B2 | 1/2003 | Ren et al. | |
| 6,512,267 B2 | 1/2003 | Kinzer et al. | |
| 6,608,350 B2 | 8/2003 | Kinzer et al. | |
| 6,693,338 B2 | 2/2004 | Saitoh et al. | |
| 6,878,989 B2 | 4/2005 | Izumisawa et al. | |
| 6,919,610 B2 | 7/2005 | Saitoh et al. | |

OTHER PUBLICATIONS

"A Novel Trench Concept for the Fabrication of Compensation Devices," M. Rub, D. Ahlers, J. Baumgartl, G. Deboy, W. Friza, O. Haberlen andl, Steinigke, pp. 203-206., ISPSD 2003, Apr. 14th-17, Cambridge, UK.

*Primary Examiner*—Fernando L Toledo
(74) *Attorney, Agent, or Firm*—Kevin B. Jackson

(57) ABSTRACT

In one embodiment, a semiconductor device is formed having charge compensation trenches in proximity to channel regions of the device. The charge compensation trenches comprise at least two opposite conductivity type semiconductor layers. A channel connecting region electrically couples the channel region to one of the at least two opposite conductivity type semiconductor layers.

20 Claims, 10 Drawing Sheets

US 7,411,266 B2

SEMICONDUCTOR DEVICE HAVING TRENCH CHARGE COMPENSATION REGIONS AND METHOD

FIELD OF THE INVENTION

This invention relates generally to semiconductor devices, and more specifically to power switching devices and methods of their manufacture.

BACKGROUND OF THE INVENTION

Metal-oxide semiconductor field effect transistors (MOSFETS) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

Today's high voltage power switch market is driven by two major parameters: breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In a conventional n-channel superjunction device, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. Although superjunction devices look promising, significant challenges still exist in manufacturing them.

Another problem with present high voltage power switch products is that they typically require a large input (e.g., gate or control electrode) charge for switching from one state to another. This requirement places, among other things, an extra burden on peripheral control circuitry.

Accordingly, high voltage power switching device structures and methods of manufacture are needed that provide lower Rdson, high BVdss, and that reduce input charge.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners.

However, those skilled in the art understand that due to the diffusion and activation of dopants the edges of doped regions are generally not straight lines and the corners are not precise angles.

In addition, the device of the present invention may embody either a cellular design (where the body regions are a plurality of cellular regions) or a single body design (where the body region is compromised of a single region formed in an elongated pattern, typically in a serpentine pattern). However, the device of the present invention will be described as a cellular design throughout the description for ease of understanding. It should be understood that it is intended that the present invention encompass both a cellular design and a single base design.

DETAILED DESCRIPTION OF A PREFERRED EMBODIMENT

Figure 1:
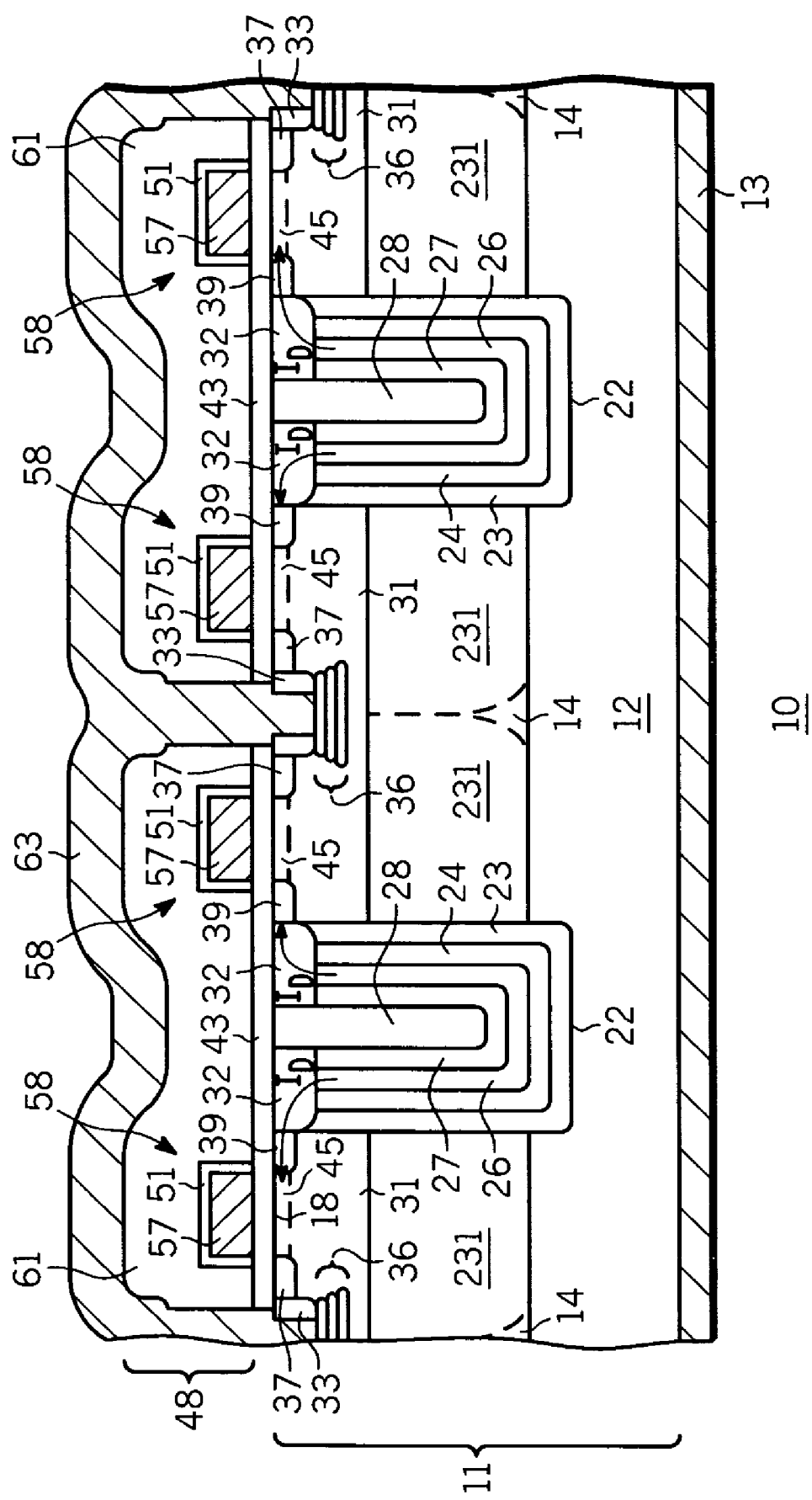
FIG. 1 illustrates an enlarged partial cross-sectional view of a semiconductor device in accordance with the present invention.

FIG. 1 shows a partial cross-sectional view of an insulated gate field effect transistor (IGFET), MOSFET, superjunction device, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in a range of approximately 0.001 to about 0.005 ohm-cm, and may be doped with arsenic. In the embodiment shown, substrate 12 provides a drain region for device 10, which is adjacent to conductive layer 13. A semiconductor layer 14 is formed in or on substrate 12, and in accordance with the present invention is n-type or p-type and doped light enough so as to not impact charge balance in the trench compensation regions described below. In one embodiment, layer 14 is formed using conventional epitaxial growth techniques. In an embodiment suitable for a 600 volt device, layer 14 is doped n-type or p-type with a dopant concentration of about $1.0 \times 10^{13}$ atoms/cm$^3$ to about $1.0 \times 10^{14}$ atoms/cm$^3$, and has a thickness on the order of about 40 microns to about 60 microns. The thickness of layer 14 is increased or decreased depending on the desired BVdss rating of device 10. In an alternative embodiment, semiconductor layer 14 comprises a graded dopant profile with semiconductor layer 14 have a higher dopant concentration in proximity to substrate 12, and transitioning either gradually or abruptly to a lower concentration for the balance of its thickness. Other materials may be used for body of semiconductor material 11 or portions thereof including silicon-germanium, silicon-germanium-carbon, carbon doped silicon, III-V materials, or the like.

In accordance with the present invention, device 10 further includes spaced apart filled trenches, semiconductor material filled trenches, epitaxial filled regions or trenches, charge compensating trench regions, deep trench charge compensation regions, charge compensating filled trenches or charge compensation regions 22. Charge compensating filled trenches 22 include a plurality of layers or multiple layers of semiconductor material, including layers of opposite conductivity type, which are preferably separated by an intrinsic or buffer semiconductor layer or layers. The intrinsic layer functions, among other things, to prevent or reduce intermixing of the opposite conductivity type layer (i.e., the two charge layers), which is believed to negatively impact the conduction efficiency of device 10 in the on state. As used herein, charge compensation generally means that the total charge of the opposite conductivity type layers is substantially balanced or equal.

In one embodiment, filled trenches 22 include multiple layers or stacked layers of semiconductor material formed using single crystal (i.e., not polycrystalline) epitaxial growth techniques. For example, filled trenches 22 include a p-type layer 23 formed on, over, or adjoining the trench walls or surfaces adjacent to body of semiconductor material 11. An intrinsic semiconductor or buffer layer 24 is formed on, over, or adjoining p-type layer 23, an n-type layer 26 is formed on, over, or adjoining intrinsic semiconductor layer 24, and an intrinsic semiconductor or buffer layer 27 is formed on, over, or adjoining n-type layer 26. Intrinsic layer 24 functions, among other things, to prevent or reduce the mixing of dopants from layers 23 and 26, which, as stated previously, improves the conduction efficiency of device 10. Intrinsic layer 27 functions, among other things, to fill or partially fill the trench. For an n-channel device and in accordance with the present invention, n-type layers 26 provide a primary vertical low resistance current path from the channel to the drain when device 10 is in an on state. When device 10 is an off state, p-type layers 23 and n-type layers 26 compensate each other in accordance with the present invention to provide an increased BVdss characteristic. It is understood that additional n-type and p-type layers may be used, and preferably separated by additional intrinsic or buffer layers. In an alternative embodiment and as shown in FIG. 1, a dielectric layer 28 is formed overlying the outermost (e.g., layer 26 or 27). In one embodiment, dielectric layer 28 fills any remaining space within trench 22. In another embodiment dielectric layer 28 only partially fills any remaining space within trench 22 leaving, for example an air gap. By way of example, dielectric layer 28 comprises an oxide or a nitride or combinations thereof. In another embodiment, dielectric layer 28 comprises a thin thermal oxide capped with a thin polysilicon layer followed by a deposited TEOS layer. It was observed that in some applications, the thin oxide capped with polysilicon reduces shear stress from the deposited oxide thereby improving device performance. It is further understood that during thermal processing, n-type and p-type dopants from layers 26 and 23 diffuse into the buffer layers, and that distinct buffer layers may or may not be present in the final device. However, when deposited or formed, buffer layers 24 and/or 27 have a lower dopant concentration than layers 23 and 26.

By way of example, p-type layers 23 and n-type layers 26 each have a dopant concentration on the order of about $9.0 \times 10^{16}$ atoms/cm$^3$ to about $3.0 \times 10^{16}$ atoms/cm$^3$, and each has a thickness of about 0.1 microns to about 0.3 microns respectively. In one embodiment, intrinsic semiconductor or buffer layers 24 and 27 are undoped or very lightly doped p-type with a dopant concentration of less than about $1.0 \times 10^{14}$ atoms/cm$^3$, and each has a thickness of about 0.5 microns to about 1.0 microns. The thickness of layer 27 is adjusted, for example, to fill the balance of the trench if dielectric layer 28 is not used.

In accordance with the present invention, dopant from p-type layer 23 is diffused into semiconductor layer 14 to form p-type regions or laterally doped or diffused regions 231 (represented as dashed lines). P-type regions 231 laterally diffusing from adjacent trenches 22 may either completely merge together, or may not completely merge as shown in FIG. 1 so that a portion of semiconductor 14 is still present in the finished device. That is, the actual diffusion distance between adjacent laterally diffused region 231 is variable.

In accordance with the present invention, in one embodiment, diffused regions 231 comprise the opposite conductivity type to that of semiconductor layer 14. This embodiment provides for a unique structure where both the active device structure and edge termination structures (not shown) are formed in the same layer (i.e., layer 14), but the active device (i.e., device 10) is in a p-type layer because of laterally diffused regions 231, and the edge termination structures are formed in n-type layer 14 laterally separated from trenches 22.

Although not shown, it is understood that during the formation of device 10, n-type dopant from highly doped substrate 12 diffuses into the lower portions of filled trenches 22 so that those portions of filled trenches 22 that are within substrate 12 become more heavily doped n-type.

Device 10 also includes a body or doped region 31 is formed in semiconductor layer 14 between and in proximity to or adjacent to, or adjoining filled trenches 22, and extends from major surface 18 of body of semiconductor material 11. In one embodiment, body regions 31 terminate laterally within buffer layer 24 and do not extend laterally into or counter-dope n-type regions 26. In one embodiment, body regions 31 comprise p-type conductivity, and have a dopant concentration suitable for forming an inversion layer that operates as conduction channels 45 of device 10. Body regions 31 extend from major surface 18 to a depth of about 1.0 to about 5.0 microns. An n-type source region 33 is formed within or in body region 31 and extends from major surface 18 to a depth of about 0.2 microns to about 0.5 microns. One or more p-type body contact regions 36 are formed in body region 31 partially within and/or below source regions 33. Body contact regions 36 are configured to provide a lower contact resistance to body region 31, and to lower the sheet resistance of body regions 31 under source regions 33, which suppresses parasitic bipolar effects.

In accordance with the present invention, device 10 further includes n-type cap regions, channel connect, or drain extension regions 32, which are formed at an upper portion of filled trenches 22. In one embodiment, channel connect regions 32 are formed adjoining major surface 18, and have the same dopant concentration and junction depth as source regions 33, and may conveniently be formed at the same time as described further in conjunction with FIGS. 2-9 below. According to the present invention, channel connect regions 32 are configured to connect or electrically couple channel regions 45 to filled trenches 22. In one embodiment and as shown in FIG. 1, device 10 also includes n-type lightly doped source regions 37 adjoining, adjacent, or juxtaposed to source regions 33 and lightly doped drain regions 39 adjoining, adjacent, or juxtaposed to channel connect regions 32. By way of example, lightly doped source regions 37 and lightly doped drain regions have a dopant concentration less than source regions 33 and channel connect regions 32 respectively, which will be further described in conjunction with FIGS. 2-9.

A gate dielectric layer 43 is formed over or adjoining major surface 18 adjacent to body region 31. In one embodiment, gate dielectric layer 43 comprises a silicon oxide, and has a thickness of about 0.05 microns to about 0.1 microns. In alternative embodiments, gate dielectric layer 43 comprises silicon nitride, tantalum pentoxide, titanium dioxide, barium strontium titanate, or combinations thereof including combinations with silicon oxide, or the like.

Conductive gate regions 57 are formed over gate dielectric layer 43. In accordance with the present invention, each conductive gate region 57 is interposed between a filled trench 22 and a source region 33. Conductive gate regions 57 comprise, for example, n-type polysilicon, and are about 0.3 microns to about 0.5 microns in thickness. Conductive gate regions 57 together with gate dielectric layer 43 form a control electrode or gate structures 58 for device 10. Gate structures 58 are configured to control the formation of channel 45 and the conduction of current in device 10.

An interlayer dielectric region 48 is formed over lying major surface 18, and comprises for example, a first dielectric layer 51 formed overlying conductive gate regions 57, and a second dielectric layer 61 formed overlying first dielectric layer 51 and other portions of major surface 18. By way of example, dielectric layer 51 comprises a silicon oxide, and has thickness from about 0.02 microns to about 0.05 microns. Dielectric layer 61 comprises for example, a deposited oxide, and has a thickness of about 0.4 microns to about 1.0 microns.

Openings are formed in interlayer dielectric region 48 to provide contacts to device 10 for source contact layer 63. As shown, a portion of major surface 18 is etched so that source contact layer 63 makes contact to both source regions 33 and body regions 36. In one embodiment, source contact layer 63 comprises a titanium/titanium nitride barrier layer and an aluminum silicon alloy formed overlying the barrier layer, or the like. Drain contact layer 13 is formed on an opposing surface of region of semiconductor material 11, and comprises, for example, a solderable metal structure such as titanium-nickel-silver, chrome-nickel-gold, or the like.

The operation of device 10 proceeds as follows. Assume that source terminal 63 is operating at a potential $V_S$ of zero volts, gate regions 57 receive a control voltage $V_G$=5.0 volts, which is greater than the conduction threshold of device 10, and drain terminal 13 operates at drain potential $V_D$=5.0 volts. The values of $V_G$ and $V_S$ cause body region 31 to invert under gate regions 57 to form channels 45, which electrically connect source regions 33 to channel connect regions 32. A device current $I_D$ flows from drain terminal 13 and is routed through n-type layers 26, channel connect regions 32, channels 45, source regions 33, to source terminal 63. Hence, current $I_D$ flows vertically through n-type layers 26 to produce a low on resistance. In one embodiment, $I_D$=1.0 amperes. To switch device 10 to the off state, a control voltage $V_G$ of less than the conduction threshold of device is applied to gate regions 57 (e.g., $V_G$<5.0 volts). This removes channels 45, $I_D$ no longer flows through device 10. In the off state, n-type layers 26 and p-type layers 23 compensate each other as the depletion region from the primary blocking junction spreads, which enhances BVdss.

Figure 2:
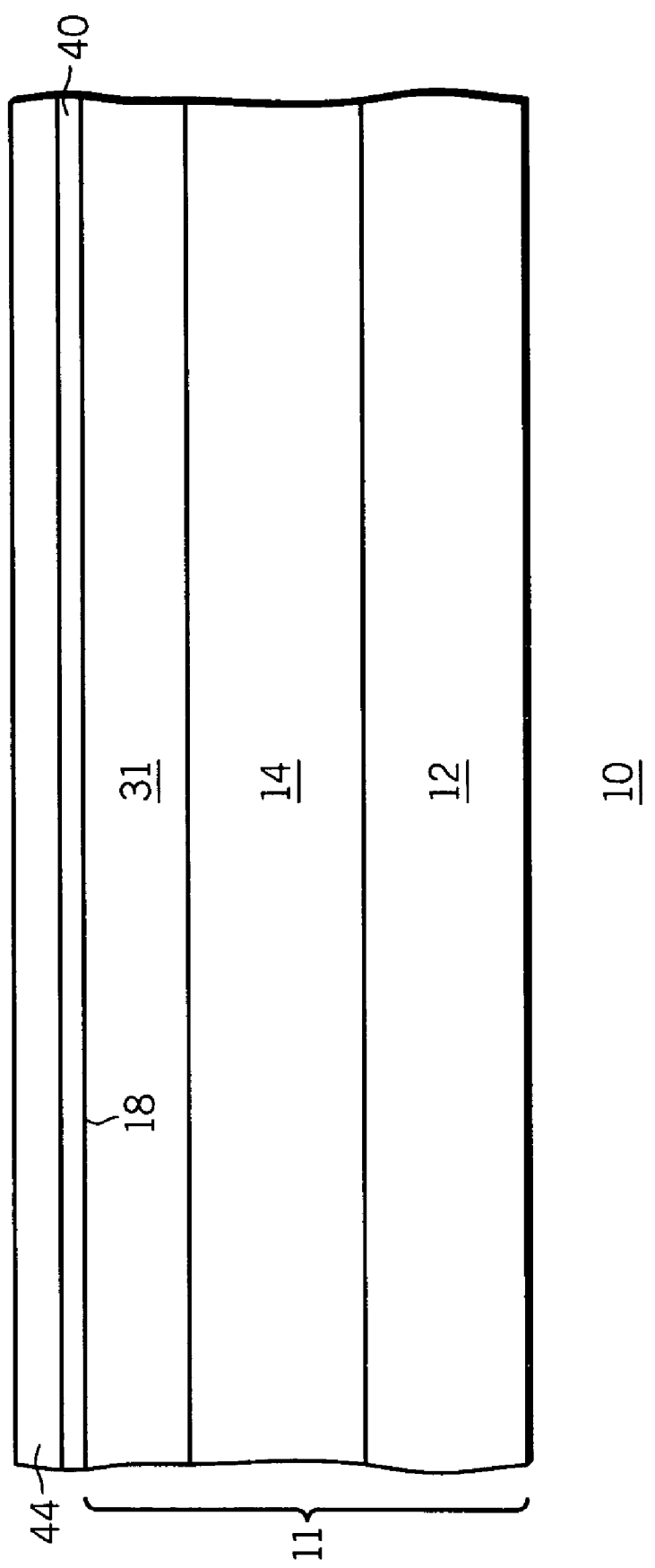
FIGS. 2-9 illustrate enlarged partial cross-sectional views of the semiconductor device of FIG. 1 at various stages of fabrication.

Turning now to FIGS. 2-9, a process for forming device 10 in accordance with the present invention is described. FIG. 2 shows an enlarged partial cross-sectional view of device 10 at an early stage of fabrication. An example of the material characteristics of body of semiconductor material 11 was provided in conjunction with FIG. 1 above. In an early step, a first dielectric layer 40 is formed over major surface 18, and comprises for example, a silicon oxide about 0.05 microns to about 0.1 microns thick. A standard photolithography step is then used to provide openings for p-type body regions 31 and edge termination structures (not shown). P-type body regions 31 are selectively formed in semiconductor layer 14 through dielectric layer 40. In an embodiment suitable for a 600 volt device, boron is implanted at a dose of about $1.0 \times 10^{13}$ atoms/$cm^2$ and an implant energy of about 160 KeV to form regions 31. A second dielectric layer 44 comprising for example a different material than first dielectric layer 40 is then formed overlying first dielectric layer 40. By way of example, second dielectric layer 44 comprises a silicon nitride when first dielectric layer 40 comprises a silicon oxide. In one embodiment, second dielectric layer 44 comprises approximately 0.2 microns of silicon nitride, and is formed using conventional deposition techniques. Next, the implanted p-type dopant is heat treated to diffuse the dopant to a desired depth to form regions 31. By way of example, body regions 31 have a depth of about 3.0 to about 5.0 microns.

Figure 3:
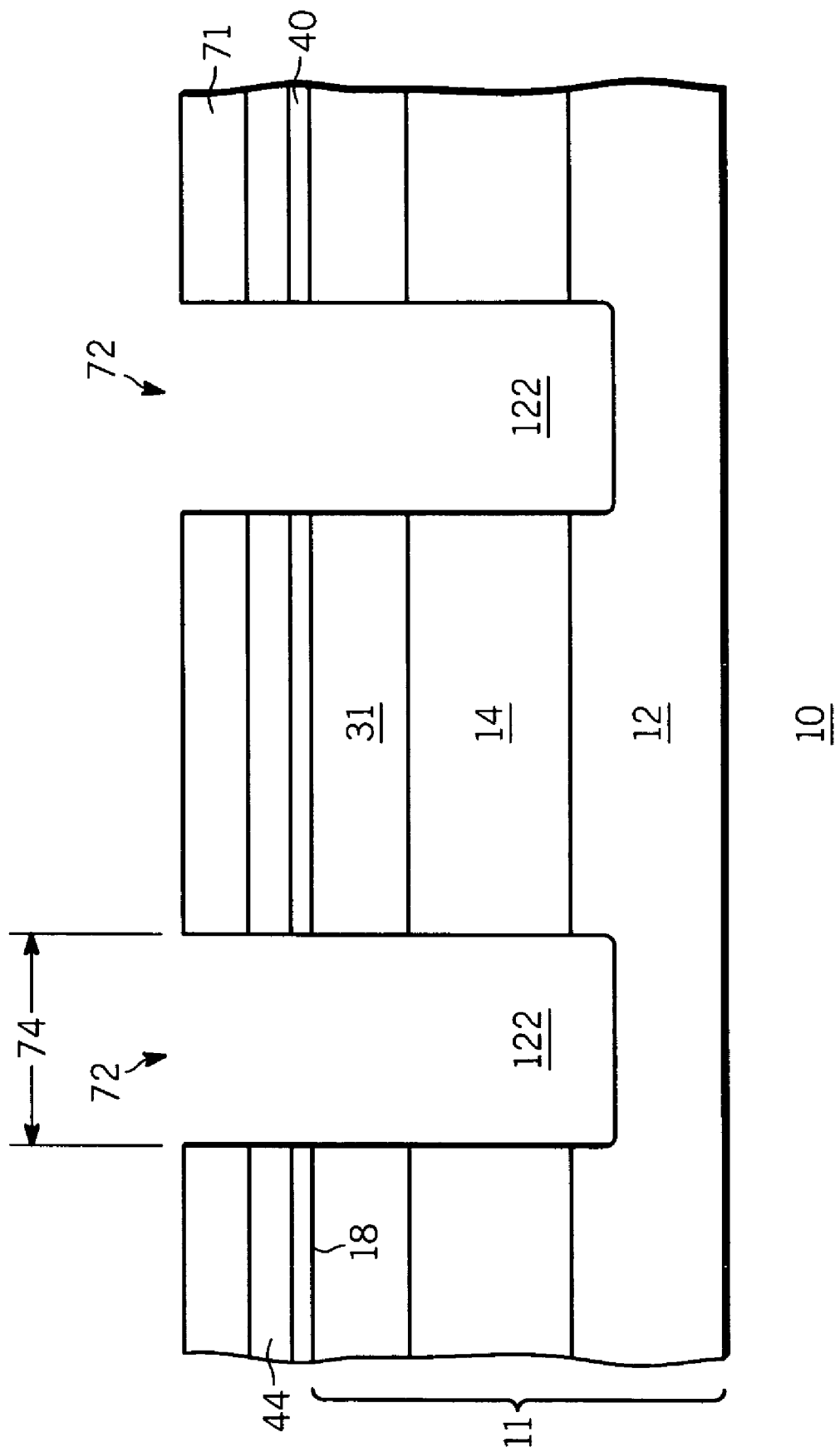

FIG. 3 shows an enlarged partial cross-sectional view of device 10 at a subsequent stage of fabrication. Hard mask layer 71 is formed overlying major surface 18 and patterned to form openings 72 through hard mask layer 71, second dielectric layer 44, and first dielectric layer 40 to expose portions of major surface 18. By way of example, hard mask layer 71 comprises about 1.0 microns of deposited oxide. By way of example, openings 72 have a width 74 on the order of about 3.0 microns to about 5.0 microns. Next, trenches 122 are formed through semiconductor layer 14. In one embodiment, trenches 122 extend into at least a portion of substrate 12. The depth of trenches 122 is determined by the thickness of semiconductor layer 14, which is a function of BVdss. In one embodiment, Deep Reactive Ion Etching (DRIE) etching with a fluorine or chlorine based chemistry is used to form trenches 122. Several techniques are available for DRIE etching including cryogenic, high density plasma, or Bosch DRIE processing. In one embodiment, trenches 122 have substantially vertical sidewalls. In an alternative embodiment, trenches 122 have a tapered profile where the width of the trench at the trench lower surface is less than width 74. Although trenches 122 are stated as plural, it is understood that trenches 122 may be a single continuous trench or connected trench matrix. Alternatively, trenches 122 may be a plurality of individual trenches with closed ends and separated by portions of body of semiconductor material 11.

Figure 4:
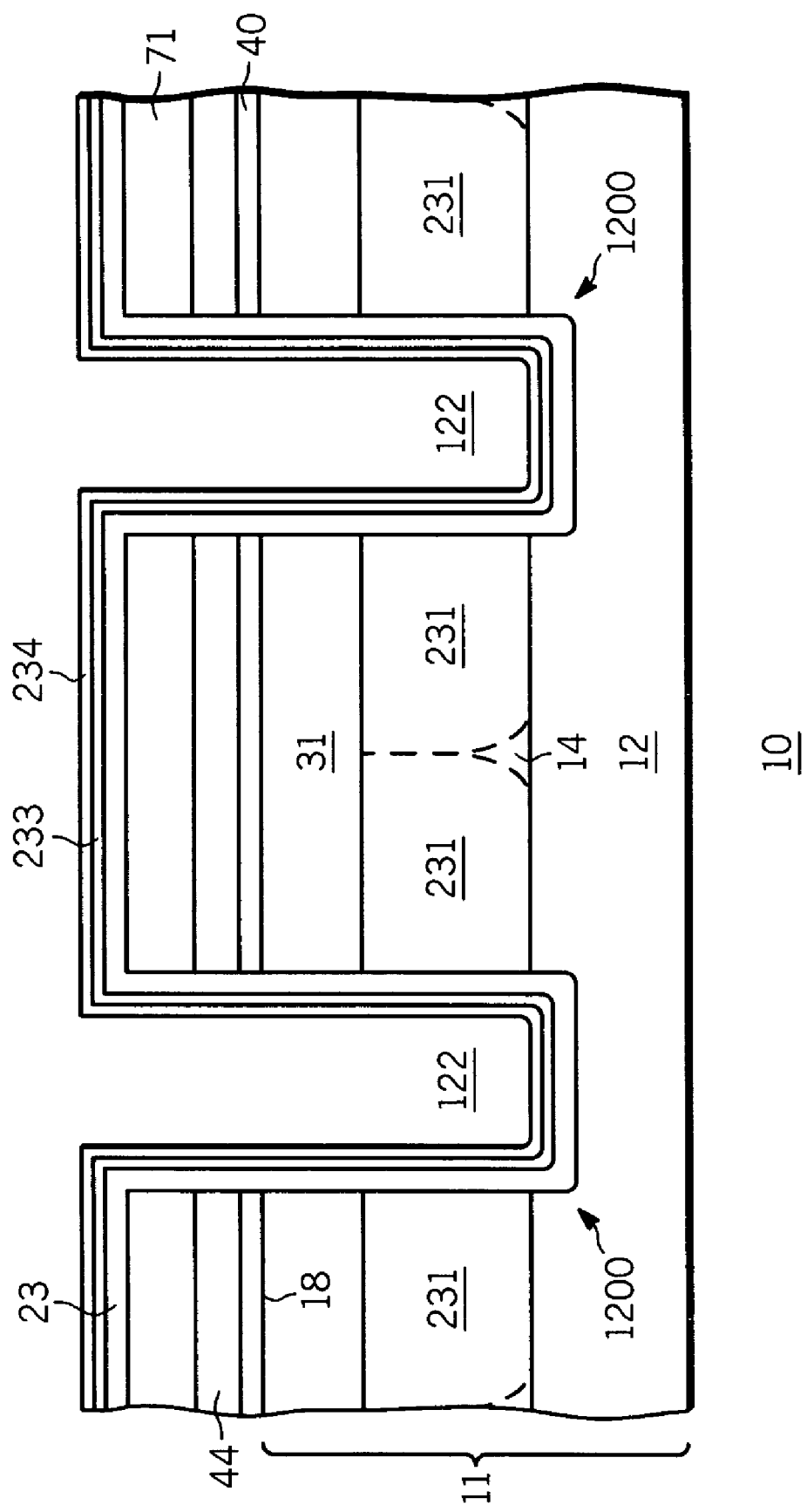

FIG. 4 shows an enlarged partial cross-sectional view of device 10 at a further stage of processing. At this point, layers of semiconductor material are formed, grown, or deposited in trenches 122 as a first stage in forming filled trenches 22. In one embodiment, single crystal semiconductor epitaxial growth techniques are used to fill trenches 122. That is, single crystal semiconductor layers are grown within trenches 122.

In a first step, a thin thermal oxide (not shown) is formed on the sidewalls of trenches 122 to remove any surface damage caused by the DRIE step. The thin thermal oxide is then removed using conventional isotropic etching techniques (e.g., 10:1 wet oxide strip). Next, body of semiconductor material 11 is placed into an epitaxial growth reactor and pre-cleaned as a first step of the epitaxial growth process. When silicon is the selected semiconductor material for the fill layers (e.g., layers 23, 24, 26, and 27), silicon source gases such as $SiHCl_3$, $SiH_2Cl_2$, $SiH_4$ or $Si_2H_6$ are suitable for forming these layers. In the embodiment shown, blanket layers are grown (i.e., the layers are grown over major surface 18 in addition to trenches 122). In an alternative embodiment, selective epitaxial growth techniques are used to form layers 23, 24, 26, and 27 so that these layers are not formed overlying major surface 18, but only within trenches 122.

P-type layer 23 is grown first along the surfaces of trenches 122, with boron being a suitable dopant source. By way of example, p-type layer 23 has a dopant concentration on the order of about $3.0 \times 10^{16}$ atoms/$cm^3$ to about $9.0 \times 10^{16}$ atoms/$cm^3$, and a thickness of about 0.1 microns to about 0.3 microns. In an optional embodiment and as shown in FIG. 4, an intrinsic layer 233 is formed overlying p-type layer 23, and has a thickness of about 0.1 microns to about 0.2 microns. A capping layer 234 is then formed overlying layer 233, and comprises for example, about 0.05 microns of thermal oxide and about 0.1 microns of nitride. Next, device 10 is heated primarily to laterally diffuse p-type dopant from layer 23 into semiconductor layer 14 to form laterally diffused p-type regions 231. Layer 234 is configured to cap p-type layer 23 during the heat treatment step to prevent dopant from outdiffusing from layer 23. Also, during the heat treatment step, n-type dopant from substrate 12 diffuses into portions 1200 of layer 23 converting portions 1200 to n-type. Further, p-type dopant in layer 23 diffuses into intrinsic layer 233 converting intrinsic layer 233 into p-type layer 23, which is shown as a continuous layer 23 in FIGS. 5-9. After the heat treatment step, capping layer 234 is removed.

Figure 5:
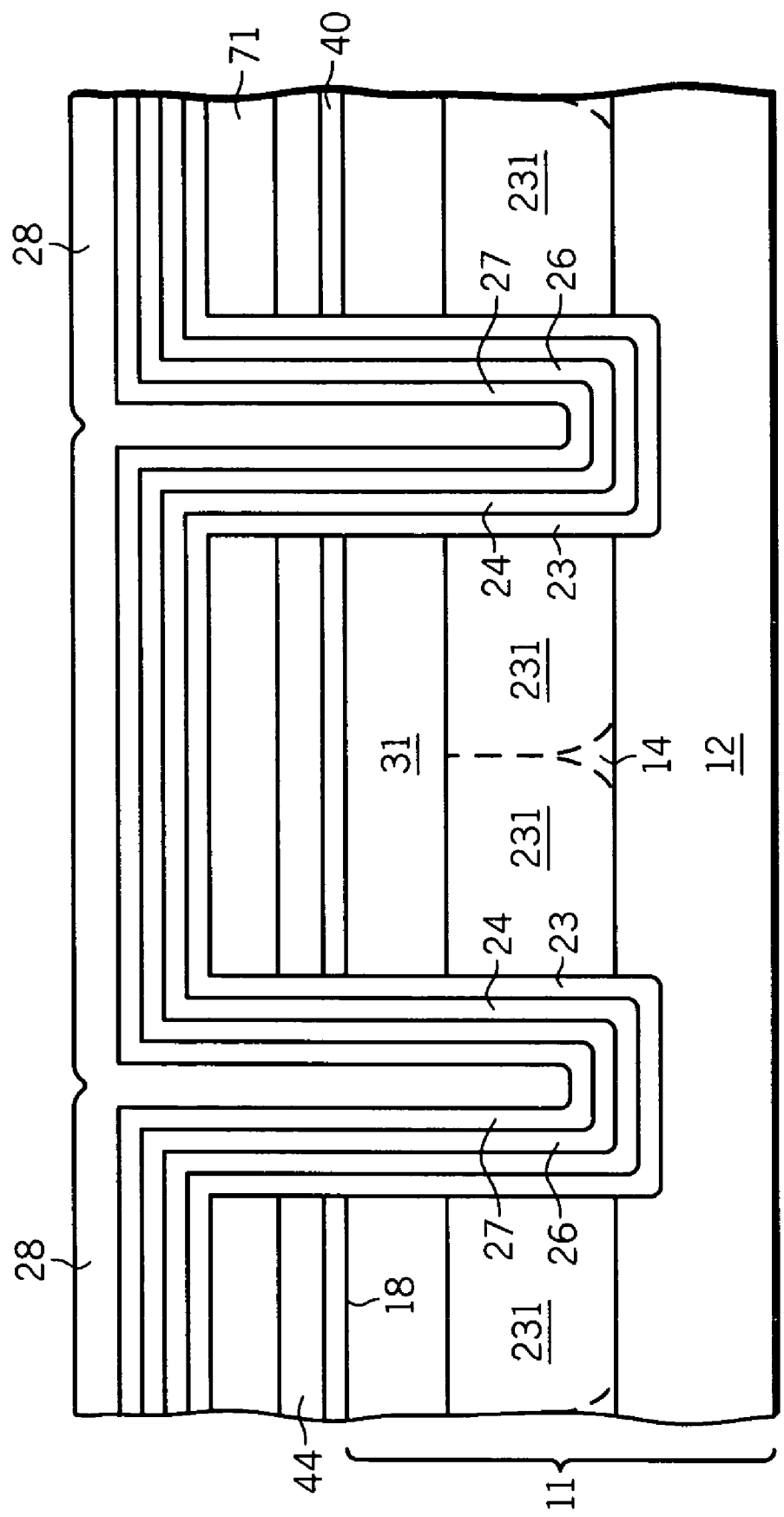

Turning now to FIG. 5, intrinsic or buffer layer 24 is grown overlying p-type layer 23, and is either undoped, or is very lightly doped p-type with a dopant concentration of less than about $2.0 \times 10^{14}$ atoms/$cm^3$. Layer 24 has a thickness of about 0.5 microns to about 1.5 microns. N-type layer 26 is then grown overlying layer 24, with a phosphorous, arsenic or antimony dopant source being suitable. In one embodiment, n-type layer 26 has a dopant concentration on the order of about $3.0 \times 10^{16}$ atoms/$cm^3$ to about $9.0 \times 10^{16}$ atoms/$cm^3$, and a thickness of about 0.1 microns to about 0.3 microns. Intrinsic or buffer layer 27 is then grown over n-type layer 26, and is either undoped (except for those trace impurities typically present in the silicon source material and/or residual dopant gases remaining in the reactor chamber after the previous growth step), or is very lightly doped n-type with a dopant concentration of less than about $2.0 \times 10^{14}$ atoms/$cm^3$. Layer 27 has a thickness of about 0.1 microns to about 0.3 microns. Next a thin wet oxide is grown over layer 27 followed by the formation of dielectric layer 28, which comprises for example a deposited oxide having a thickness suitable to fill trenches 122. In one embodiment, multiple steps are used to form dielectric layer 28, with etch-back or planarization steps done in between deposition steps to ensure that trenches 122 are filled to a desired level. It should be understood that the thicknesses of layers 23, 24, 26, 27, and 23 are adjusted depending on the width of trenches 122.

Figure 6:
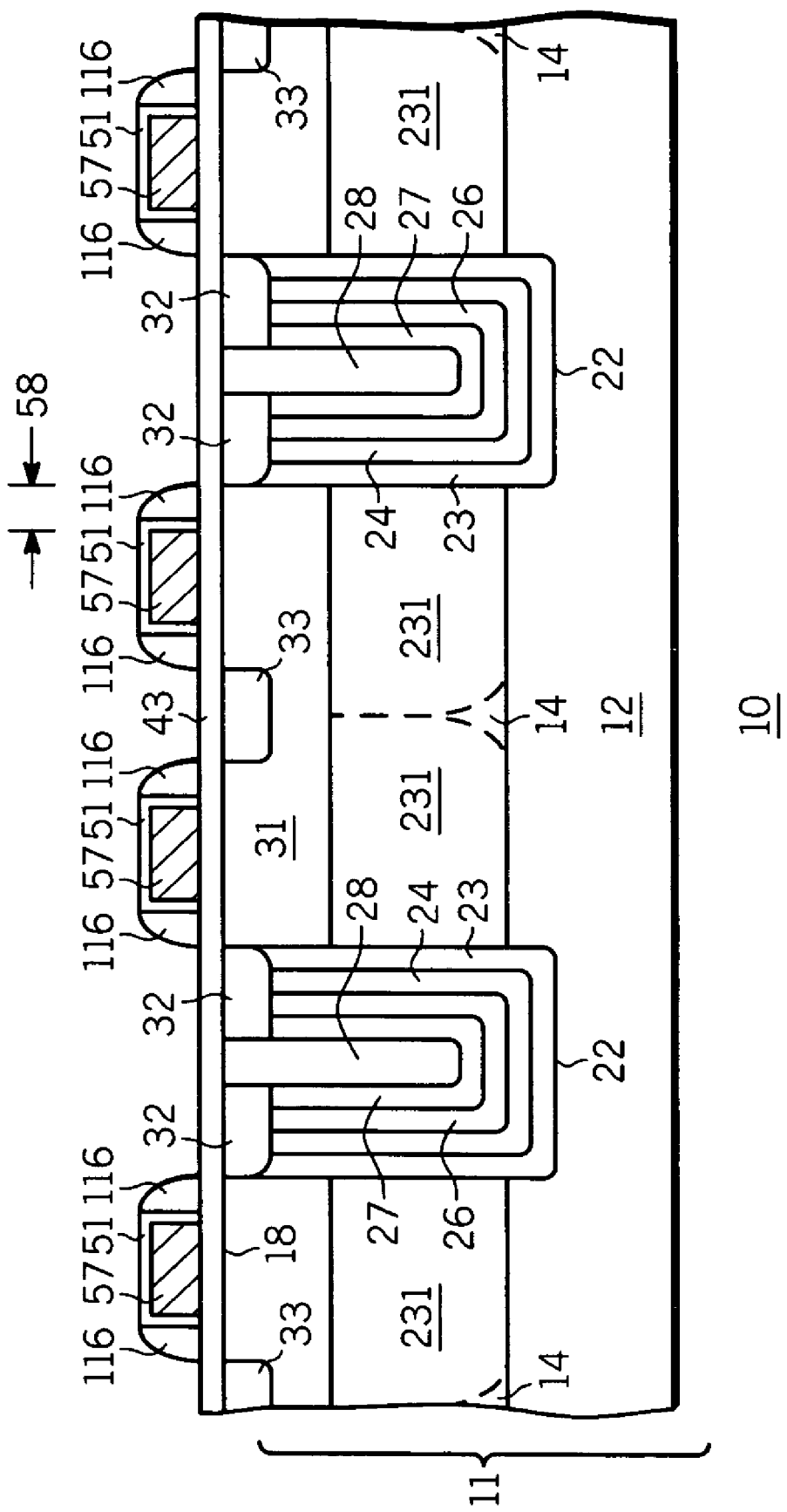

FIG. 6 shows an enlarged partial cross-sectional view of device 10 at a still further stage of fabrication after layers 28, 27, 26, 24, 23, are planarized down to, back to, or in proximity with major surface 18 to form filled trenches 22. By way of example, etch back or chemical mechanical planarization techniques are used to planarize these layers. In one embodiment, a polysilicon layer and a photoresist layer are formed overlying dielectric layer 28, and the layers are then etched back or planarized using second dielectric layer 44 as a stop layer. Layers 44 and 40 are then removed using conventional techniques.

Next, gate dielectric layer 43 is formed overlying major surface 18. In one embodiment, gate dielectric layer 43 comprises silicon oxide, and has a thickness of about 0.05 microns to about 0.1 microns. A conductive layer such as a doped or undoped polysilicon layer is deposited overlying gate dielectric layer 43 and patterned to form gate conductive regions 57. For example, gate conductive regions 57 comprise about 0.2 microns of doped or undoped polysilicon. If gate conductive regions are initially undoped, these regions as subsequently doped during the formation of regions 32 and 33. Note that in one embodiment, gate conductive regions 57 are spaced apart (i.e., do not overlap) a distance 58 from filled trenches 22 to allow for spacer techniques to be used in form regions 32, 33, 37 and 39 in accordance with the present invention.

A passivation layer is then formed overlying major surface 18 and patterned to form first dielectric layer 51. By way of example, first dielectric layer 51 comprising about 0.02 microns to about 0.1 microns of oxide. A spacer layer is then formed overlying major surface 18 and etched to form spacers 116. By way of example, spacers 116 comprise about 0.2 microns of polysilicon. It is understood that the thickness of spacer 116 is adjusted depending on the desired lateral width of regions 37 and 39. Channel connect regions 32 and source regions 33 are then formed self-aligned to spacers 116. By way of example, a phosphorous implant dose of $3.0 \times 10^{15}$ atoms/$cm^2$ with an implant energy of 80 KeV is used for this doping step. The implanted dopant is either annealed and diffused at this step, or is annealed after the formation of the other doped regions described below.

Figure 7:
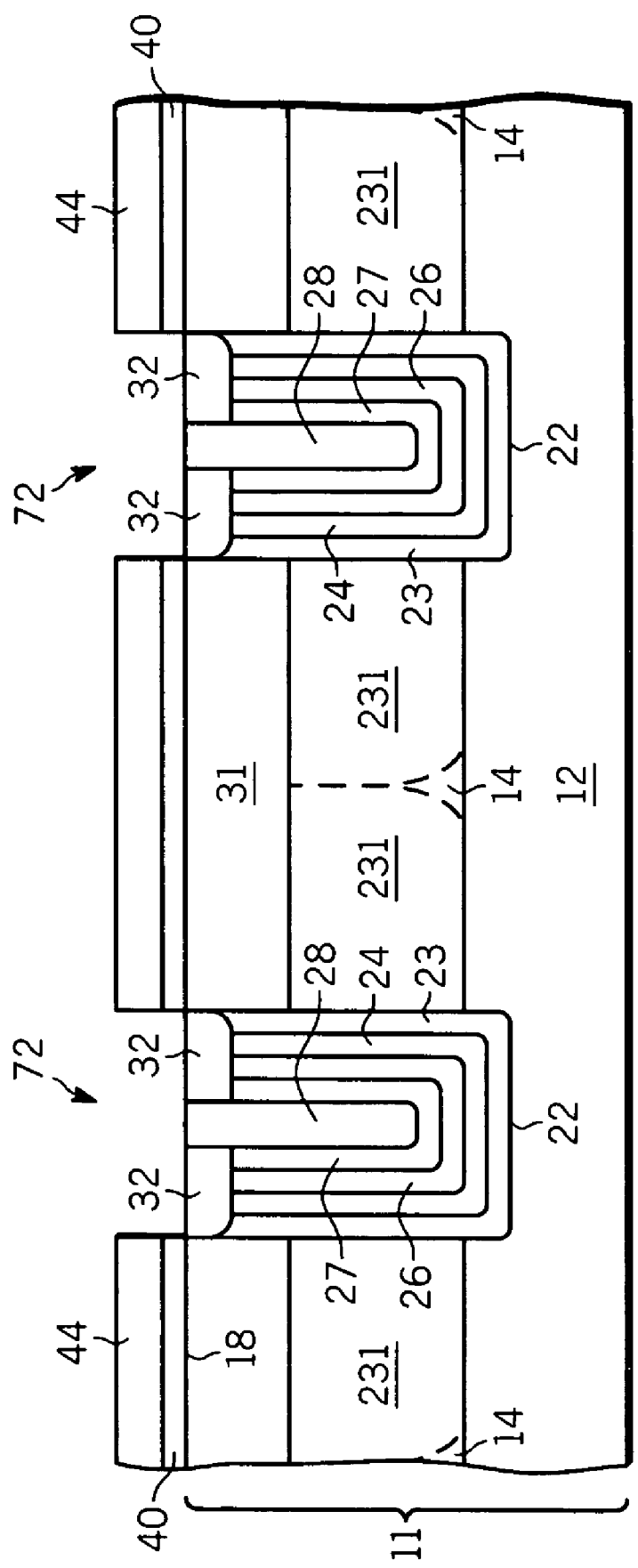

FIG. 7 shows an enlarged partial cross-sectional view device 10 according to an alternative method for forming channel connect regions 32. This alternative method would occur after layers 28, 27, 26, 24, and 23 are etched back or planarized in proximity to major surface 18 while leaving second dielectric layer 44 at least partially in place overlying portions of major surface 18. N-type dopant is then introduced through openings 72 using second dielectric layer 44 as a mask. By way of example, an phosphorous implant dose of about $1.0 \times 10^{15}$ to about $3.0 \times 10^{15}$ atoms/$cm^2$ with an implant energy of 80 KeV is used for this doping step. Layers 44 and 40 are then removed, and gate dielectric layer 43 is formed overlying major surface 18.

Figure 8:
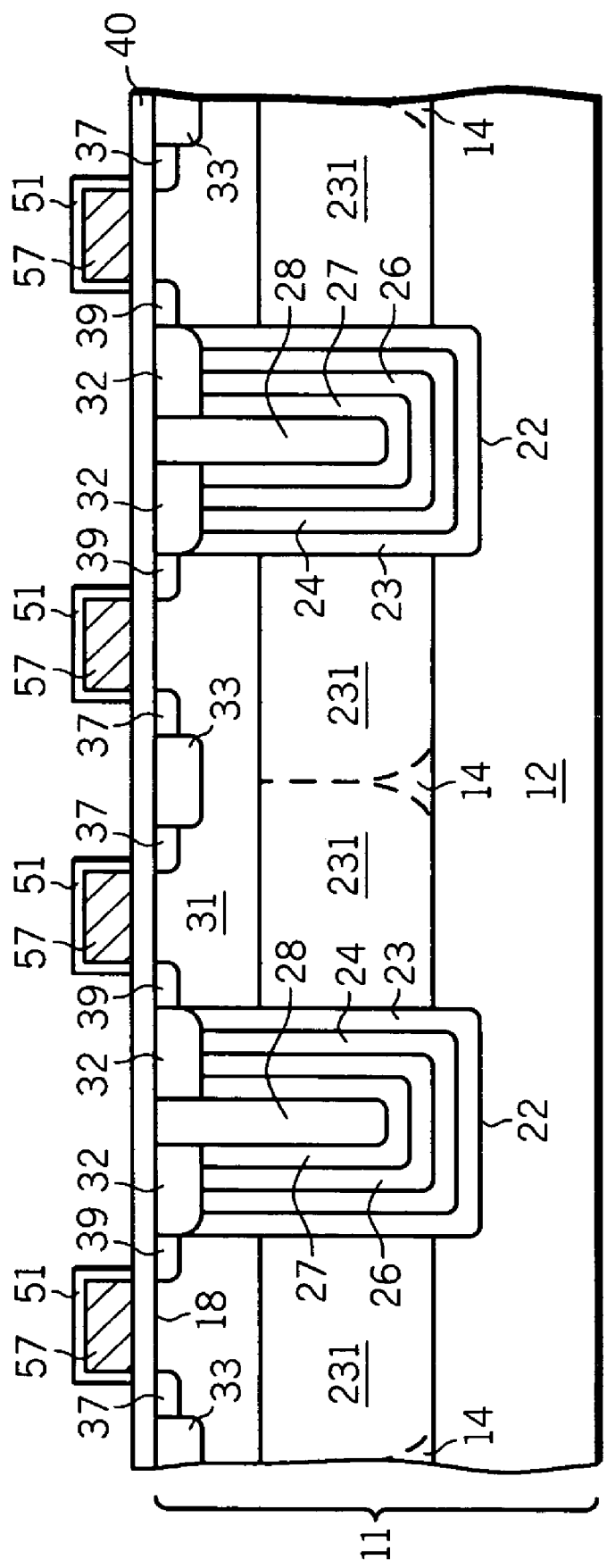

FIG. 8 shows an enlarged partial cross-sectional view of device 10 at another stage of fabrication. Spacers 116 are removed, and lightly doped source regions 37 and lightly doped drain regions 39 are then formed adjacent source regions 33 and channel connect regions 32 respectively. By way of example, an phosphorous implant dose of about $1.0 \times 10^{14}$ atoms/$cm^2$ to about $3.0 \times 10^{14}$ atoms/$cm^2$ with an implant energy of 60 KeV is used for this doping step.

Figure 9:
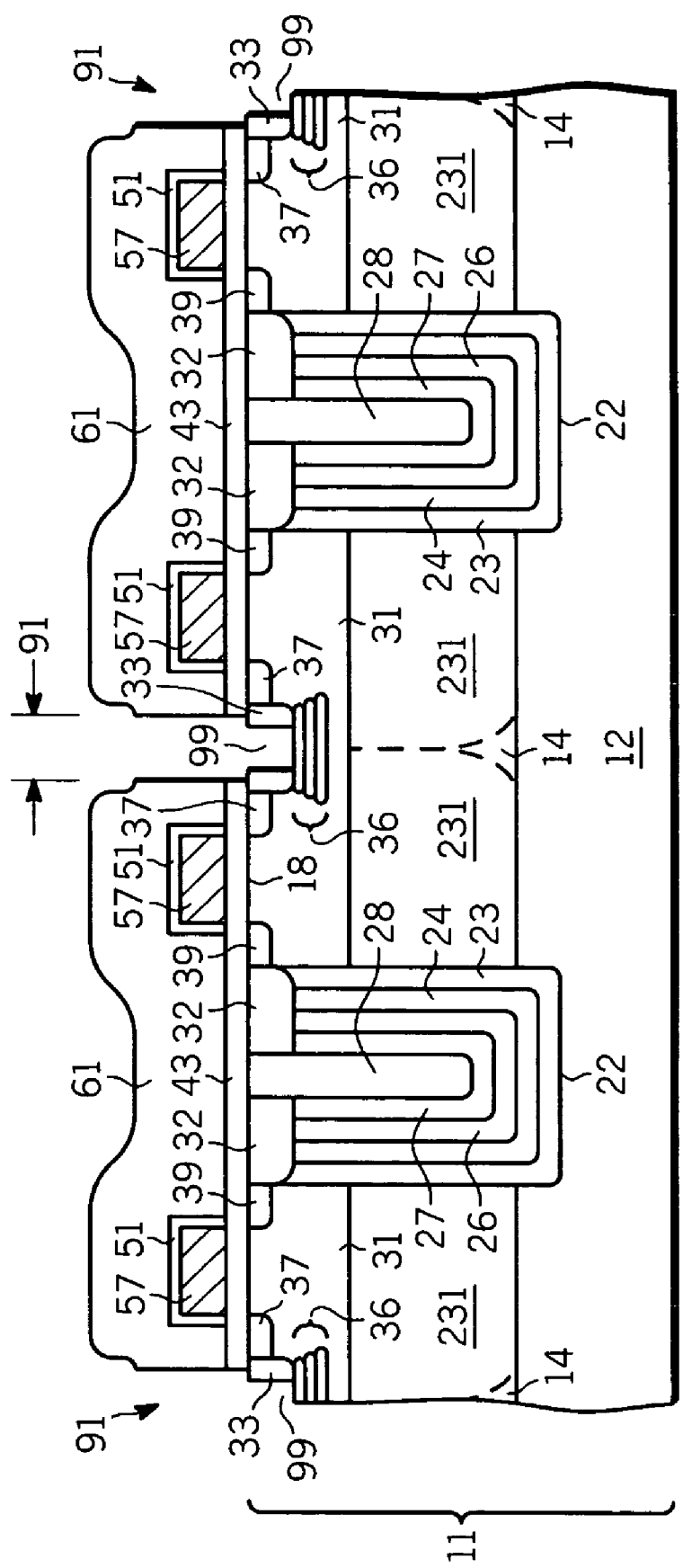

FIG. 9 shows an enlarged partial cross-sectional view of device 10 after additional processing. Passivation or dielectric layer 61 is formed overlying major surface 15. By way of example, layer 61 comprises a deposited oxide and has a thickness from about 0.5 microns to about 1.0 microns. A contact photolithography step is used to form openings 91, to expose portions of major surface IS above source regions 33. Next an optional conformal spacer layer is formed overlying major surface 13 and etched to form spacers (not shown) on the sidewalls of layer 61 within openings 91. An optional isotropic etch is used to widen openings 91 near the outer surface of layer 61 as shown in FIG. 9. Major surface 13 is then exposed to an etchant that removes material from semiconductor layer 14 to form recessed regions 99. Next, body contact regions 36 are formed through openings 91 and recessed regions 99. In one embodiment, a series of implants or a chain of implants are used so that body contact regions 36 comprise a plurality of regions as shown in FIG. 9. In one embodiment, three boron implants are used with increasing implant energies to provide the tapered shape shown in FIG. 9. That is, a higher ion implant energy provides a deeper and wider region while a lower ion implant energy provides a shallower and narrower region. By way of example, a first implant of boron at dose from about $1.0 \times 10^{14}$ atoms/cm$^2$ to about $1.0 \times 10^{15}$ atoms/cm$^2$ and an energy of about 200 KeV is used, then a second implant of boron at about $1.0 \times 10^{14}$ atoms/cm$^2$ to about $1.0 \times 10^{15}$ atoms/cm$^2$ and an energy of about 100 KeV is used, and then a third implant of boron at about $1.0 \times 10^{14}$ atoms/cm$^2$ to about $1.0 \times 10^{15}$ atoms/cm$^2$ and an energy of 25-30 KeV is used to form region 36. In an alternative method, body contact regions 36 are formed prior the formation of dielectric layer 61 using conventional masking techniques. Dielectric layer 61 is then formed and patterned thereafter.

After body contact region 36 is formed, the spacers are removed from openings 91, and source contact or conductive layer 63 is formed overlying major surface 18. By way of example, a barrier structure is formed such as titanium/titanium nitride followed by a layer comprising aluminum or an aluminum alloy. The conductive layers are then patterned using conventional photolithographic and etch techniques to form source contact layer 63 as shown in FIG. 1. In one embodiment, a final passivation layer is used overlying source contact layer 63, and comprises a deposited oxide, a deposited nitride or combinations thereof. Device 10 is then thinned, and drain contact layer 13 is formed contacting substrate 12 as shown in and further described in conjunction with FIG. 1.

Figure 10:
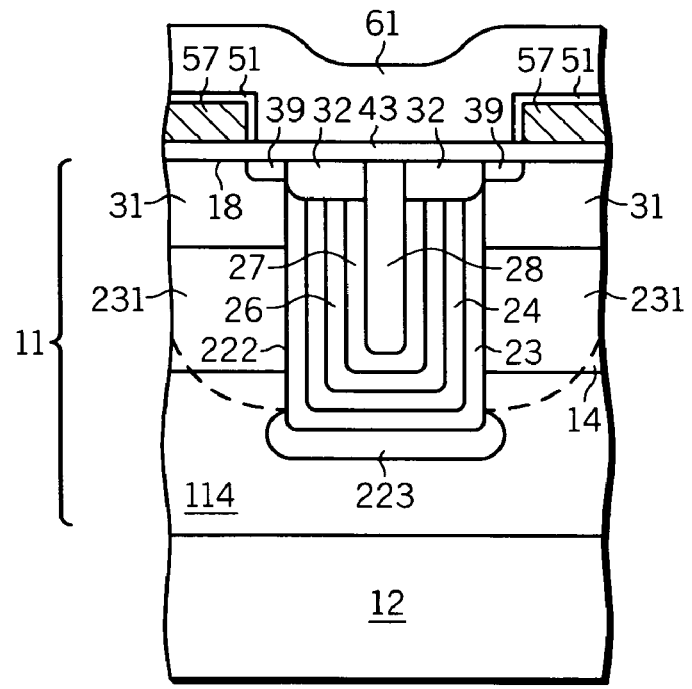
FIG. 10 illustrates a highly enlarged partial cross-sectional view of a portion of a semiconductor device according to another embodiment of the present invention.

FIG. 10 shows a highly enlarged partial cross-sectional view of a portion of a semiconductor device 100 having a filled compensating trench region according to another embodiment of the present invention. Device 100 similar to device 10 except that body of semiconductor material 11 comprises an n-type substrate 12, an n-type buffer layer 114 that has a lower dopant concentration than substrate 12 (e.g., about 20-35 ohm-cm) and thickness of about 10 microns to about 20 microns. Also, in device 100, filled trench 222 does not extend all the way through buffer layer 114. In this embodiment, after trenches 122 are etched, n-type dopant is introduced through the lower surface of trenches 122 to form an n+ region 223 adjacent a lower surface of trenches 122, which functions to counter-dope p-type layer 23 to electrically connect filled trench 222 to buffer epi layer 114. This embodiment is suitable for manufacturing devices of various breakdown voltages using the same filled trench process. The various breakdown voltages are then achieved using different buffer layer 114 dopant concentrations and thicknesses.

Figure 11:
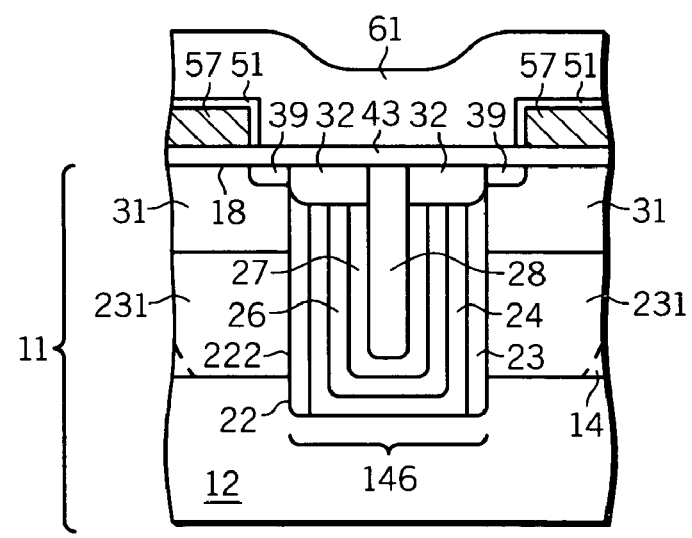
FIG. 11 illustrates a highly enlarged partial cross-sectional view of a portion of a semiconductor device according to a further embodiment of the present invention.

FIG. 11 shows a highly enlarged partial cross-sectional view of a portion of a semiconductor device 110 having a filled compensating trench region according to a further embodiment of the present invention. Device 110 is similar to device 10 except that after p-type layer 23 is deposited, that portion of p-type layer 23 along bottom portion 146 of trench 122 is removed to provide an enhanced conduction path between substrate 12 and n-type layer 26.

In summary, a new switching device structure having deep trench charge compensation regions has been described including a method of manufacture. The deep trench charge compensation regions are spaced apart from source regions of the device, and channel connect regions are used to electrically connect the source regions to the deep trench charge compensation regions when the device is in operation.

The device further includes laterally doped regions formed using the trench structures to form the primary blocking junction of the device.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device comprising:
   a region of semiconductor material having a first major surface;
   a trench compensation region formed in the region of semiconductor material extending from the first major surface, wherein the trench compensation region comprises a plurality of opposite conductivity type semiconductor layers;
   a body region formed in the region of semiconductor material;
   a source region formed in the body region and laterally spaced apart from the trench compensation region;
   a gate structure formed between the source region and trench compensation region, wherein the gate structure includes a conductive gate region configured to establish a channel region in the body region when the device is in operation;
   a channel connecting region formed at an upper portion of the trench compensation region configured to electrically connect the channel region to the trench compensation region when the device is in operation; and
   a doped region extending laterally from the trench compensation region into the region of semiconductor material and below the body region, wherein the doped region and body region comprise a first conductivity type, and wherein the channel connecting region comprises a second and opposite conductivity type.

2. The device of claim 1 wherein the region of semiconductor material and the body region comprise the same conductivity type.

3. The device of claim 1 wherein the region of semiconductor material and the body region comprise opposite conductivity types.

4. The device of claim 1 wherein the trench is filled with a plurality of single crystal epitaxial layers including:
   a first layer of a first conductivity type formed overlying sidewalls and a lower surface of the trench; and
   a second layer of a second and opposite conductivity type formed overlying the first layer.

5. The device of claim 4 further comprising a first buffer layer formed between the first and second layers, wherein the buffer layer has a lower dopant concentration than the first and second layers when deposited.

6. The device of claim 1 further comprising a lightly doped source region formed between the source region and conductive gate region.

7. The device of claim 1 further comprising a lightly doped drain region formed between the channel connecting region and the conductive gate region.

8. The device of claim 1, wherein the region of semiconductor material comprises a semiconductor substrate and a semiconductor layer formed overlying the semiconductor substrate and having a lower dopant concentration than the semiconductor substrate.

9. The device of claim 8, wherein the semiconductor substrate and the semiconductor layer have opposite conductivity types.

10. The device of claim 8, wherein the semiconductor layer has a graded doping profile.

11. The device of claim 8, wherein the trench compensation region extends through the semiconductor layer into the semiconductor substrate.

12. The device of claim 8, wherein the trench compensation region terminates within the semiconductor layer, and wherein the device further comprises a doped region formed adjacent a lower surface of the trench compensation region and configured to electrically couple the trench compensation region to the semiconductor substrate when the device is in operation.

13. A method for forming a semiconductor device comprising the steps of:
providing a region of semiconductor material having a first major surface;
forming a trench in the region of semiconductor material extending from the first major surface;
forming a plurality of semiconductor layers within the trench including at least two opposite conductivity type semiconductor layers, and at least one buffer layer separating the at least two opposite conductivity type semiconductor layers to form a filled trench compensation region, wherein the buffer layer has a lower dopant concentration less than the at least two opposite conductivity type semiconductor layers at formation;
forming a control electrode overlying the first major surface and laterally separated from the filled trench compensation region, the control electrode configured to form a channel in the region of semiconductor material during operation;
forming a first doped region at least partially within the filled trench compensation region configured to electrically couple the channel region to the filled trench compensation region during operation; and
forming a second doped region extending laterally from the trench compensation region into the region of semiconductor material, wherein the second doped region comprises a first conductivity type, and wherein the first doped region comprises a second and opposite conductivity type.

14. The method of claim 13, wherein the step of forming the plurality of semiconductor layers comprises the steps of:
forming a first layer of a first conductivity type overlying sidewall and lower surfaces of the trench;
forming a first buffer layer overlying the first layer;
forming a second layer of a second conductivity type overlying the buffer layer;
forming a second buffer layer overlying the second layer, wherein the first and second buffer layers have lower dopant concentrations than the first and second layers at formation; and
filling a remaining portion of the trench with a dielectric material.

15. The method of claim 14 further comprising the steps of:
forming a cap layer on the first layer before forming the first buffer layer;
diffusing dopant from the first layer into the region of semiconductor material to form a second doped region of the first conductivity type; and
removing the cap layer.

16. The method of claim 13, wherein the step of providing the region of semiconductor material includes providing a semiconductor substrate of a first conductivity type and having a semiconductor layer formed overlying the semiconductor substrate, and wherein the method further includes the steps of:
forming a body region of a second conductivity type in the semiconductor layer; and
forming a source region of the first conductivity type in the body region and laterally spaced apart from the filled trench compensation region, and wherein the source region and first region are self-aligned to the control electrode.

17. The method of claim 16 further comprising the steps of:
forming a lightly doped source region adjoining the source region; and
forming a lightly doped drain region adjoining the first doped region.

18. A semiconductor superjunction device comprising:
a region of semiconductor material having a first major surface;
a trench compensation region extending into the region of semiconductor material from the first surface including a first layer of a first conductivity type overlying sidewalls and a lower surface of the trench compensation region and a second layer of a second conductivity type overlying the first layer;
a body region of the first conductivity type formed in the region of semiconductor material adjacent the trench compensation region;
a source region of the second conductivity type formed in the body region and laterally spaced apart from the trench compensation region so that the source region does not overlie the trench compensation region;
a gate structure formed overlying the first major surface and interposed between the source region and trench compensation region, wherein the gate structure is laterally spaced apart from the trench compensation region so that a portion of the body region is at the first major surface between the gate structure and trench compensation region, and wherein the gate structure is configured to form a channel in the body region when the device is in operation; and
a first doped region of the second conductivity type formed at least partially within the trench compensation region overlying the first and second layers and configured to electrically couple a drain end of the channel to the second layer when the device is in operation.

19. The device of claim 18 wherein the region of semiconductor material comprises a semiconductor substrate and a semiconductor layer formed overlying the semiconductor substrate, the device further comprising a second doped of the first conductivity type formed in the semiconductor layer and extending laterally from the trench compensation region.

20. The device of claim 19, wherein the semiconductor layer comprises the first conductivity type.

* * * * *